(12) United States Patent
Zaderej et al.

(10) Patent No.: US 7,394,650 B2
(45) Date of Patent: Jul. 1, 2008

(54) HINGE FOR AN ELECTRONIC DEVICE

(75) Inventors: Victor Zaderej, St. Charles, IL (US); Michael J. Neumann, Woodridge, IL (US)

(73) Assignee: Molex Incorporated, Lisle, IL (US)

( * ) Notice: Subject to any disclaimer, the term of this patent is extended or adjusted under 35 U.S.C. 154(b) by 250 days.

(21) Appl. No.: 10/881,644

(22) Filed: Jun. 30, 2004

(65) Prior Publication Data

US 2006/0002058 A1  Jan. 5, 2006

(51) Int. Cl.
*H05K 5/00* (2006.01)

(52) U.S. Cl. .......................................... 361/679; 16/267

(58) Field of Classification Search .................. 16/386, 16/267, 268; 361/679
See application file for complete search history.

(56) References Cited

U.S. PATENT DOCUMENTS

| | | | |
|---|---|---|---|
| 3,860,312 A | 1/1975 | Gordon, Jr. | |
| 4,764,121 A | 8/1988 | Ditzig | |
| 4,854,881 A | 8/1989 | Ditzig | |
| 4,865,553 A | 9/1989 | Tanigawa et al. | |
| 5,027,394 A * | 6/1991 | Ono et al. | 379/434 |
| 5,253,142 A | 10/1993 | Weng | |
| 5,278,993 A | 1/1994 | Reiff et al. | |
| 5,628,089 A * | 5/1997 | Wilcox et al. | 16/303 |
| 5,681,176 A | 10/1997 | Ibaraki et al. | |
| 6,011,699 A * | 1/2000 | Murray et al. | 361/814 |
| 6,122,167 A * | 9/2000 | Smith et al. | 361/687 |
| 6,266,238 B1 * | 7/2001 | Paulsel et al. | 361/683 |
| 6,272,324 B1 | 8/2001 | Rudisill et al. | |
| 6,616,467 B2 * | 9/2003 | Ibaraki et al. | 439/165 |
| 6,885,549 B2 * | 4/2005 | Thomason | 361/683 |
| 7,054,147 B2 * | 5/2006 | Maatta et al. | 361/681 |
| 2001/0036845 A1 | 11/2001 | Park | |
| 2004/0141287 A1 * | 7/2004 | Kim et al. | 361/683 |

FOREIGN PATENT DOCUMENTS

| | | |
|---|---|---|
| EP | 0590413 | 4/1994 |
| EP | 1147783 | 10/2001 |
| GB | 2073961 | 10/1981 |
| JP | 2001198714 | 1/2003 |

OTHER PUBLICATIONS

"Connector/Hinge for Laptop Computer Liquid Crystal Display", IBM Technical Disclosure Bulletin, Feb. 1992, pp. 29-32, vol. 34 No. 9, IBM Corp. Armonk NY, US.
International Search Report, European Patent Office, Oct. 31, 2005.

* cited by examiner

*Primary Examiner*—Jayprakash N Gandhi
*Assistant Examiner*—Ingrid Wright
(74) *Attorney, Agent, or Firm*—Robert J. Zeitler

(57) ABSTRACT

A hinge for an electronic device is provided. The electronic device has a first half and a second half. The hinge includes a rigid, multi-layer printed wiring board capable of being electrically coupled to the first half of the electronic device, and a flexible circuit electrically connected to the printed wiring board and capable of being electrically coupled to the second half of the electronic device. The printed wiring board is fixed relative to the first half. When the second half of the electronic device is moved relative to the first half, the flexible circuit winds and unwinds.

19 Claims, 2 Drawing Sheets

HINGE FOR AN ELECTRONIC DEVICE

FIELD OF THE INVENTION

This invention relates to a hinge interconnect, and more particularly, to a hinge interconnect for electrically connecting two halves of an electronic device together.

BACKGROUND OF THE INVENTION

Electronic devices, such as notebook computers, personal digital assistants (PDAs), cellular telephones, portable compact disc (CD) players, GPS devices, gaming devices and the like, are often designed with clamshell type or flip-up covers into which electronic components are added. These electronic components must be electrically connected to the electronic components in the other half of the electronic device through a hinged interface.

Such electronic devices are incorporating several items of functionality, such as cellular telephone, full function PDAs, gaming devices, radios, televisions, personal identification devices, computers wireless ports, and the like, into one full service electronic device. As a result, there is a need for higher speed signals and a greater number of signals to be transmitted between the halves of the electronic device.

One current trend in electronic devices is to form the device as a "clamshell". In a clamshell electronic device, it is possible to incorporate more functions, include larger displays, and add a variety of unique features. One of the challenges with a clamshell electronic device, however, is the need to transmit the high-speed signals, which may include radio-frequency signals, and the number of signals through a relatively small hinge (i.e. 4.5 mm diameter). This has to be done reliably and needs to have a service life of several hundred thousand cycles. To date, this has been a significant challenge and manufacturers of these products are looking for a cost effective and reliable solution.

Some manufacturers interconnect the electronic components in the halves by a multilayered flexible circuit that is routed through the hinge and mated to the printed wiring boards or displays on the opposite half. These flexible circuits are expensive, are difficult to install in the electronic device and require extensive manual labor. In addition, the hinge and the interconnect therethrough tend to have a reliability problem. As the need for the number of circuits increases and as the need for higher speed signals increases, the flexible circuit interconnect becomes relatively thick and inflexible. This results in reliability issues with its use in the field.

Often, if the hinge and/or flexible circuit fails, the entire device is disposed of instead of replacing the damaged components. Also, as color is being used in more electronic devices, the replacement of the entire electronic device is no longer cost effective.

Some manufacturers have used mechanical hinges that have some form of a sliding contact or rubbing contact between the upper and lower halves of the electronic device. These mechanical hinges are prone to wear associated with the high number of cycles and the inability to transmit radio frequency signals.

Some manufacturers have used small radio frequency cables routed through the hinge of the electronic device. These radio frequency cables are expensive and are difficult to assemble with the electronic device.

The present invention provides a hinge and interconnect which provides a solution to these problems. Other features and advantages will become apparent upon reading the attached description of the invention, in combination with a study of the drawings.

OBJECTS AND SUMMARY OF THE INVENTION

An object of the present invention is to provide a hinge for an electronic device, such as a notebook computer, a personal digital assistant (PDA), a cellular telephone, a portable compact disc (CD) player and the like, which is reliable in use.

Another object of the present invention is to provide a hinge for an electronic device which is easy to install into the electronic device.

Yet another object of the present invention is to provide a hinge for an electronic device which can be easily replaced if damaged.

Briefly, and in accordance with the foregoing, a hinge for an electronic device, such as a notebook computer, a personal digital assistant (PDA), a cellular telephone, a portable compact disc (CD) player and the like, is provided. The electronic device has an upper half and a lower half connected in part by the hinge. The hinge includes a rigid, multi-layer printed wiring board, a connector electrically coupled to the printed wiring board and capable of being electrically connected to the first half of the electrical device, and a flexible circuit electrically connected to the printed wiring board and capable of being electrically coupled to the second half of the electronic device. The printed wiring board is fixed relative to the first half. A pair of end caps are mounted at spaced locations on the printed wiring board. A cover surrounds a portion of the printed wiring board and the flexible circuit. The cover includes an opening therein, through which the flexible circuit extends. The cover generally overlays the end caps and is capable of moving relative to the end caps. The second half of the electronic device is moved relative to the first half of the electronic device. Upon this movement, the flexible circuit winds and unwinds, and the cover moves with the second half of the electronic device.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
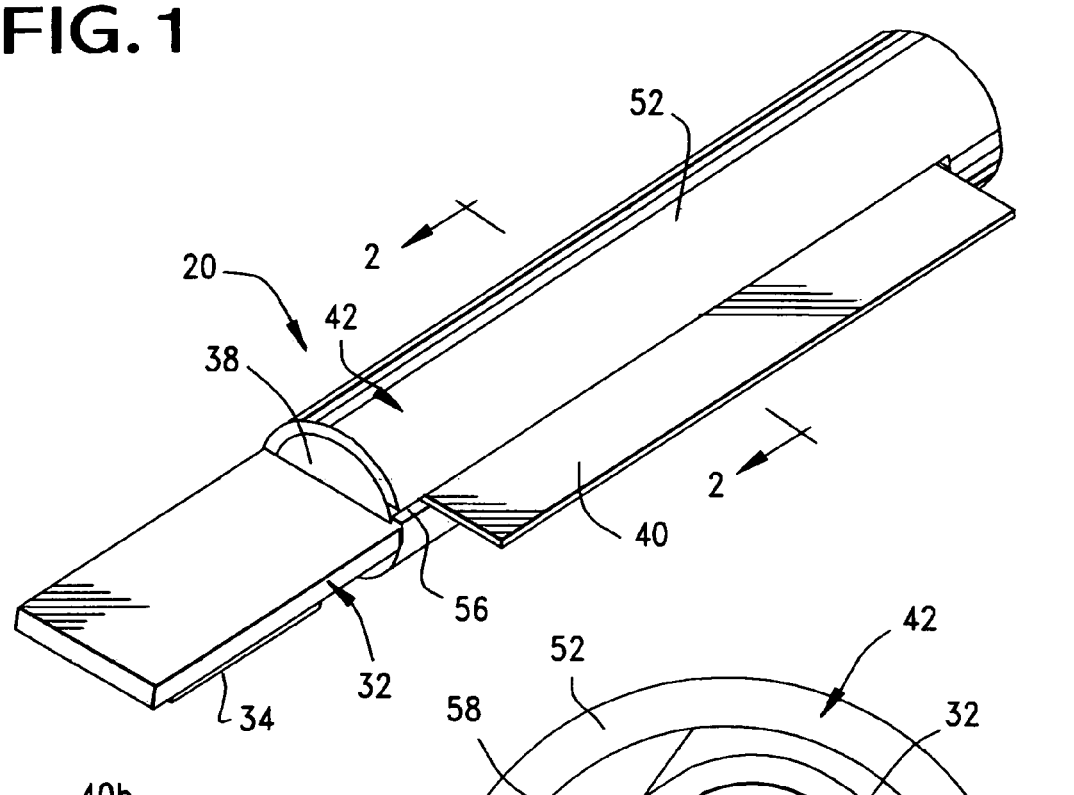
FIG. 1 is a perspective view of a hinge which incorporates the features of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 3:
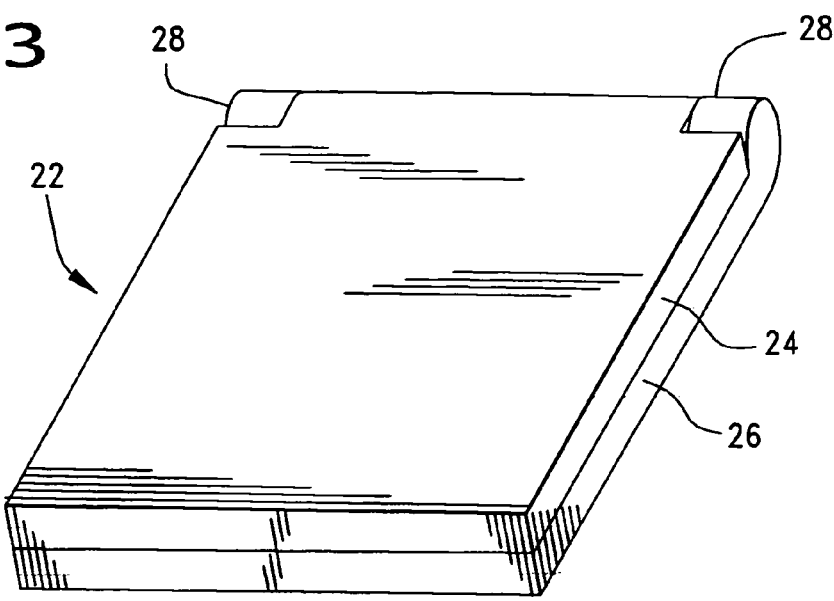
FIG. 3 is a perspective view of an electronic device into which the hinge can be provided.
Figure 4:
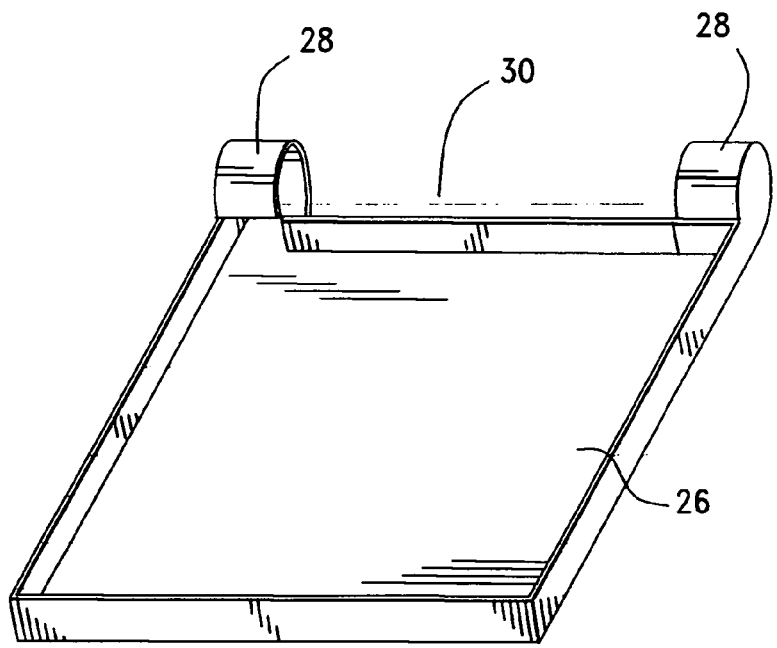
FIG. 4 is a perspective view of the electronic device of FIG. 1 with an upper half removed to show a receiving space for the hinge.
Figure 6:
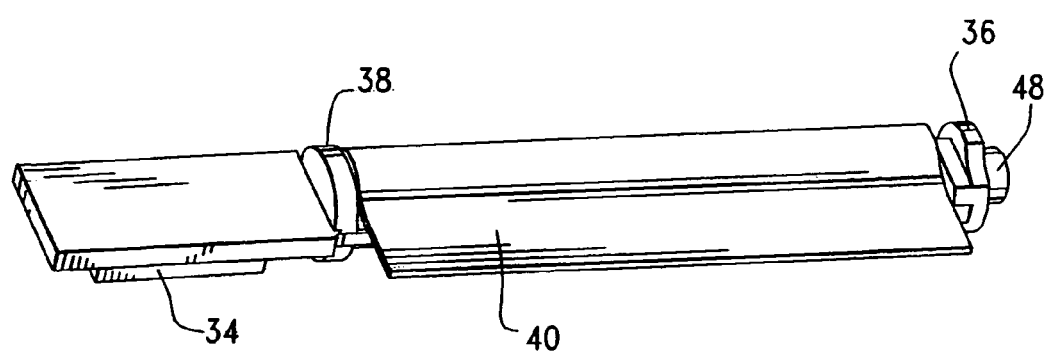
FIG. 6 is a perspective view of the printed wiring board, the connector, a pair of end caps and a flexible circuit used in forming the hinge.

A hinge 20, shown in FIG. 1, which incorporates the features of the present invention is used in an electronic device 22, such as a notebook computer, a personal digital assistant (PDA), a cellular telephone, a portable compact disc (CD) player and the like. As shown in FIG. 3, the electronic device 22 is of a clamshell design and includes an upper half 24 and a lower half 26 which are connected together by interconnecting components provided within curved portions 28 between the upper and lower halves 24, 26. The upper half 24 houses electrical components, such as a display, etc., and the lower half 26 houses electrical components such as a keyboard, etc. which are electrically connected together by the hinge 20. The hinge 20 is mounted into a hinge receiving space 30 between the upper and lower halves 24, 26. As such, the upper half 24 can close onto the lower half 26 by rotation around the hinge 20 and the interconnecting components provided within the curved portions 28.

The hinge 20 is electrically connected to the electrical components in the upper half 24 of the electronic device 22 and electrically connected to a printed wiring board (not shown) in the lower half 26 of the electronic device 22. The hinge 20 includes a multi-layer, rigid printed wiring board 32, a connector 34, a pair of end caps 36, 38, a flexible circuit 40 and a cover 42.

Figure 5:
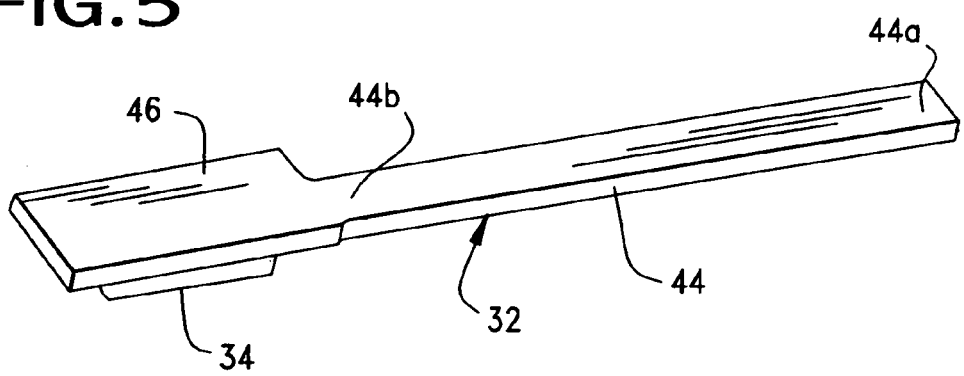
FIG. 5 is a perspective view of a printed wiring board and a connector used in forming the hinge.

As best illustrated in FIG. 5, the multi-layer printed wiring board 32 is elongated and includes a first portion 44 having first and second opposite ends, and a second portion 46 provided at the second end of the first portion 44. The first portion 44 has a reduced width to that of the second portion 46, and has a length which is substantially longer than the second portion 46. A centerline of the first portion 44 is offset from a centerline of the second portion 46. The printed wiring board 32 can be formed with as many layers as desired, and may have a number of signals, for example, 20 to 80 signals is not uncommon. The printed wiring board 32 provides impedance (50 ohm) controlled traces extending along the length of the first and second portions 44, 46.

The connector 34 is mounted on the underside of the second portion 46 of the printed wiring board 32. The connector 34 plugs into the printed wiring board (not shown) in the lower half 26 of the electronic device 22. The connector 34 is conventional.

The end caps 36, 38 are preferably formed of plastic. One end cap 36 is located at the first end 44a of the first portion 44 of the printed wiring board 32 and the other end cap 38 is located at the second end 44b of the first portion 44 of the printed wiring board 32. The end caps 36, 38 are suitably connected to the printed wiring board 32 so as to not interfere with the signals being transmitted along the printed wiring board 32. Each end cap 36, 38 has a generally circular exterior surface. The end cap 36 located at the first end of the first portion 44 includes a cylindrical boss 48 extending therefrom in a direction opposite to the first portion 44.

The flexible circuit 40 provides the "moving path" between the rigid printed wiring board 32 and the upper half 24 of the electronic device 22. A first end of the flexible circuit 40 is electrically connected to the underside of the printed wiring board 32 on the same side as the connector 34. The flexible circuit 40 can be soldered to the printed wiring board 32 with lead free solder; can be ultrasonically welded thereto; attached by pressure contact, such as by using a dimple and adhesive; using a conductive adhesive; and the like. A strain relief 50, which can be formed of epoxy, is provided at the joint between the printed wiring board 32 and the flexible circuit 40 to alleviate the stress on the joint. Alternatively, the first end 40a of the flexible circuit 40 can be incorporated directly into the printed wiring board 32 and bonded thereto by suitable means. The second, free end 40b of the flexible circuit 40 can be soldered to a mating feature in the upper half 24 of the electronic device 22 or can be extended into the upper half 24 of the electronic device 22 and have components, displays, etc. mounted thereto, such as by edge mounting.

The flexible circuit 40 is very thin, i.e. 2 mils to 10 mils, is impedance controlled where necessary, and is capable of winding and unwinding several hundred thousand cycles with high reliability because it is thin and compliant. The flexible circuit 40 has internal copper layers which are in the neutral axis, thereby minimizing the potential for breakage.

The cover 42 is formed of an outer cylinder wall 52 having a cylindrical passageway 54 that extends the length of the cover 42. The outer wall 52 overlays the first portion 44 of the printed wiring board 32, overlays a portion of the flexible circuit 40 and generally overlays the end caps 36, 38. The outer wall 52 does not overlay the boss 48. An elongated opening 56 extends along substantially the entire length of the outer wall 52. The second, free end of the flexible circuit 40 passes through the opening 56. A rounded protrusion 58 is provided proximate the opening 54 on an inner surface of the cover 42. The cover 42 is preferably formed of plastic or a metalized plastic.

Figure 2:
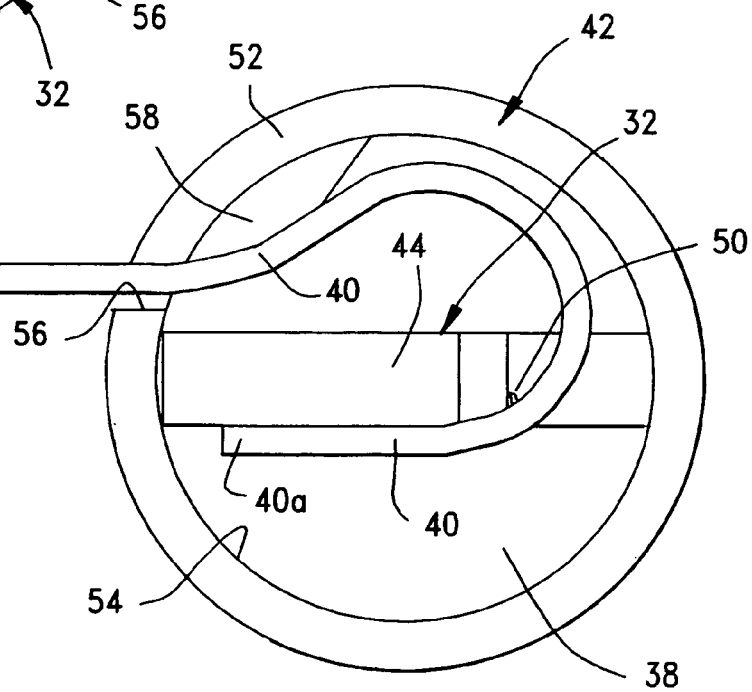
FIG. 2 is a cross-sectional view of the hinge through line 2-2 of FIG. 1.

The cylindrical interior surface of the outer wall 52 and the circular exterior surfaces of the end caps 36, 38 generally abut against each other, with sufficient spacing therebetween to allow the cover 42 to freely slide relative to the end caps 36, 38. As best illustrated in FIG. 2, the portion of the flexible circuit 40 that is located within the cover 42 wraps around the printed wiring board 32 and extends outwardly through the opening 56. A predetermined bending radius is determined for the flexible circuit 40 to prevent kinks or breaks in the flexible circuit 40. The flexible circuit 40 abuts against the rounded protrusion 58 on the interior of the cover 52 to prevent a sharp turning of the flexible circuit 40 at the opening 56. The cover 42 locates the flexible circuit 40 and controls the motion of the flexible circuit 40 therewithin as the flexible circuit 40 winds and unwinds.

Once the hinge 20 is assembled, the hinge 20 forms a stand-alone assembly which is separate from the remainder of the electronic device 22. Therefore, the hinge 20 forms a subassembly which can be easily assembled into the electronic device 22 with a minimum number of steps. To assemble the hinge 20 with the electronic device 22, the hinge 20 is placed within the hinge receiving space 30 and the connector 34 is mated with the printed wiring board (not shown) in the lower half 26 of the electronic device 22 to hold an end of the hinge 20. The second end of the flexible circuit 40 is mated with the electrical components in the upper half 24. Corresponding structure is provided in the electronic device 22 into which the boss 48 is positioned to hold the other end of the hinge 20. Therefore, the rigid printed wiring board 32 is fixed into position relative to the lower half 26 of the electronic device 22.

When the upper half 24 is rotated relative to the lower half 26, the hinge 20 provides for continuous electrical continuity between the two halves 24, 26. As the upper half 24 is opened, the flexible circuit 40 unwinds within the cover 42. The engagement between the flexible circuit 40 and the opening 56 in the cover 42 causes the cover 42 to move with the upper half 24. As the upper half 24 is closed, the flexible circuit 40 winds within the cover 42. Again, the engagement between the flexible circuit 40 and the opening 56 in the cover 42 causes the cover 42 to move with the upper half 24. The cover 42 controls the motion of the flexible circuit 40 therewithin as the flexible circuit 40 winds and unwinds. The hinge 20 is very reliable and will withstand repeated rotation.

If the hinge 20 becomes damaged, only the hinge 20 will need to be replaced and the connections between the upper and lower halves 24, 26 reinstated. The entire electronic device 22 does not need to be discarded. The hinge 20 can be easily disassembled from the electronic device 22 with a minimum number of steps. To disassemble the hinge 20 with the electronic device 22, the connector 34 is unmated from the printed wiring board (not shown) in the lower half 26 of the electronic device and the second end of the flexible circuit 40 is unmated from the electrical components in the upper half 24. Thereafter, the hinge 20 is lifted out of the hinge receiving space 30.

While a preferred embodiment of the present invention is shown and described, it is envisioned that those skilled in the art may devise various modifications of the present invention without departing from the spirit and scope of the appended claims.

What is claimed is:

1. A hinge for an electronic device having a first half and a second half which are rotatable relative to each other, the hinge comprising:
   a rigid printed wiring board capable of being electrically coupled to the first half of the electronic device and being fixed rotationally relative to the first half of the electronic device when electrically coupled thereto, said printed wiring board having a first side, a second side opposite to said first side and opposite edges extending between said first side and said second side;
   a flexible circuit having a first end electrically connected to the first side of the printed wiring board and having a second end capable of being electrically coupled to the second half of the electronic device, said flexible circuit is capable of wrapping around a portion of said printed wiring board within said cover such that said flexible circuit overlays one of said edges and at least a portion of the second side of the printed wiring board, said flexible circuit within said cover being separated from said second side of said printed wiring board only by air; and
   a cover surrounding at least a portion of the printed wiring board and surrounding a portion of the flexible circuit such that the first end of the flexible circuit is within the cover, the cover including an opening therein, wherein a portion of the flexible circuit extends through the opening such that the second end of the flexible circuit is exterior to the cover,
   awherein the cover, the printed wiring board and the flexible circuit are formed as a subassembly for assembly with the first and second halves of the electronic device.

2. A hinge as defined as in claim 1, wherein the printed wiring board has multi-layers.

3. A hinge as defined in claim 1, further including a connector electrically coupled to the printed wiring board and capable of providing the electrical connection between the printed wiring board and the first half of the electronic device.

4. A hinge as defined in claim 3, wherein said connector is electrically connected to said first side of said printed wiring board.

5. A hinge as defined in claim 1, wherein said cover includes a protrusion proximate the opening against which the flexible circuit can abut.

6. A hinge as defined in claim 1, further including a pair of end caps provided at spaced locations on the printed wiring board, the cover generally overlaying the end caps and being capable of moving relative to the end caps.

7. A hinge as defined in claim 6, wherein the end caps are formed of plastic and the cover is formed of plastic.

8. A hinge as defined in claim 6, wherein each end cap has a generally cylindrical exterior surface and the cover has a generally cylindrical interior surface.

9. A hinge as defined in claim 8, wherein the end caps are formed of plastic and the cover is formed of plastic.

10. A hinge as defined in claim 1, wherein said printed wiring board extends outwardly from an end of the cover.

11. A hinge as defined in claim 1, wherein said opening in said cover has a predetermined length and said flexible circuit spans substantially the entire length of said opening.

12. A hinge as defined in claim 1, further including a stress relief attached to said edge that said flexible circuit overlays.

13. A hinge for an electronic device having a first half and a second half, the hinge comprising:
    a rigid, multi-layer printed wiring board;
    a connector electrically coupled to the printed wiring board and capable of being electrically coupled to the first half of the electronic device, said printed wiring board having a first side, a second side opposite to said first side and opposite edges extending between said first side and said second side;
    a flexible circuit having a first end electrically connected to the first side of the printed wiring board and having a second end capable of being electrically coupled to the second half of the electronic device, said flexible circuit is capable of wrapping around a portion of said printed wiring board within said cover such that said flexible circuit overlays one of said edges and at least a portion of the second side of the printed wiring board, said flexible circuit within said cover being separated from said second side of said printed wiring board only by air;
    a pair of end caps mounted at spaced locations on the printed wiring board;
    a cover which surrounds at least a portion of the printed wiring board and which surrounds a portion of the flexible circuit, the cover including an opening therein, a portion of the flexible circuit extending through the opening, the cover generally overlaying the end caps and being capable of rotationally moving relative to the end caps.

14. A hinge as defined in claim 13, wherein said cover includes a protrusion proximate the opening against which the flexible circuit can abut.

15. A hinge as defined in claim 13, wherein the end caps are formed of plastic and the cover is formed of plastic.

16. A hinge as defined in claim 13, wherein each end cap has a generally cylindrical exterior surface and the cover has a generally cylindrical interior surface.

17. A hinge as defined in claim 13, wherein said opening in said cover has a predetermined length and said flexible circuit spans substantially the entire length of said opening.

18. A hinge as defined in claim 13, wherein said connector is electrically connected to said first side of said printed wiring board.

19. A hinge as defined in claim 13, further including a stress relief attached to said edge that said flexible circuit overlays.

* * * * *